(12) United States Patent
Yasuda

(10) Patent No.: US 7,071,116 B2
(45) Date of Patent: Jul. 4, 2006

(54) SEMICONDUCTOR DEVICE AND METHOD FOR MANUFACTURING SAME

(75) Inventor: Makoto Yasuda, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 10/867,789

(22) Filed: Jun. 16, 2004

(65) Prior Publication Data

US 2004/0259374 A1    Dec. 23, 2004

(30) Foreign Application Priority Data

Jun. 19, 2003 (JP) ............... 2003-174948
May 17, 2004 (JP) ............... 2004-146464

(51) Int. Cl.
  H01L 21/302 (2006.01)
  H01L 21/461 (2006.01)
(52) U.S. Cl. .................... 438/751; 438/792
(58) Field of Classification Search ........... 438/627, 438/751, 770, 775, 788, 792, 907
See application file for complete search history.

(56) References Cited

U.S. PATENT DOCUMENTS 5,470,792 A * 11/1995 Yamada ............. 438/625

2003/0181031 A1 * 9/2003 Kojima et al. ............. 438/627

FOREIGN PATENT DOCUMENTS

JP       10-32248       2/1998

OTHER PUBLICATIONS

S. Gwo, et al., "Local Electric-Field-Induced Oxidation of Titanium Nitride Films". Applied Physics Letters, vol. 74. No. 8, Feb. 22, 1999, pp. 1090-1092.

* cited by examiner

Primary Examiner—Phuc T. Dang
(74) Attorney, Agent, or Firm—McGinn IP Law Group, PLLC

(57) ABSTRACT

The temperature of the sputtering process for forming the Ti film is selected to a temperature within a range of from 200 degree C. to 225 degree C. to provide stable film quality against oxidization (step 11). The irradiation with ultraviolet is conducted before applying the photo resist to reduce positive electric charge (step 12), and nitrogen plasma processing is conducted during the etching of the via hole and after the plasma stripping processing to reduce positive electric charge (steps 13 and 14), and the resistivity of the rinse liquid at the organic stripping is controlled to obtain equal to or lower than 0.3MΩ cm (step 15). Further, the RF-spattered thickness during the RF sputtering process for the barrier metal film is set to 18 nm to 22 nm to remove TiOn film (step 16).

21 Claims, 18 Drawing Sheets (a) CONVENTIONAL
(b) HEATING TiN AT 200 °C
(c) UV IRRADIATION
(d) FIRST NITROGEN PLASMA PROCESSING
(e) SECOND NITROGEN PLASMA PROCESSING
(f) RESISTIVITY NOT HIGHER THAN 0.3 (MΩ·cm)
(g) RF-SPUTTERED THICKNESS 20 nm

PRIOR ART

PRIOR ART

PRIOR ART

US 7,071,116 B2

SEMICONDUCTOR DEVICE AND METHOD FOR MANUFACTURING SAME

This application is based on Japanese patent applications NO. 2003-174948 and NO. 2004-146464, the contents of which are incorporated herein by reference.

BACKGROUND OF THE INVENTION

1. Field of the Invention

The present invention relates to a method for manufacturing a semiconductor device for forming a via hole that is adopted to electrically connect an aluminum interconnect line to other layer.

2. Description of the Related Art

A via hole is generally employed to connect an interconnect line such as aluminum interconnect line in a semiconductor device to an electrode or the like of an element disposed in a different layer that contains the interconnect line (see, for example, JP-A-H10-32,248 (1998)). A conventional method for manufacturing a semiconductor device to form such a via hole is shown in FIG. 8. Process steps for forming a via hole are also shown in FIGS. 9 and 10. Descriptions thereof will be made as follows in reference to FIGS. 8 to 10.

First, as shown in FIG. 9A, a barrier metal layer (not shown) consisting of a titanium (Ti) film and a titanium nitride (TiN) film or a barrier metal layer consisting of only a TiN film is deposited on an SiOx layer 1 formed on a semiconductor substrate (not shown). Subsequently, an aluminum film, which will compose an aluminum interconnect line 2, is deposited on this barrier metal layer. A Ti film and a TiN film, which compose another barrier metal layer 3, are then deposited on the aluminum film in this order via a sputtering process (see FIG. 8, step 101). The sputtering process for depositing the aluminum film, which will compose an aluminum interconnect line 2, is conducted at a wafer temperature around 300 to 350 degree C. The sputtering process for depositing the Ti film composing the barrier metal layer 3 is carried out by utilizing remaining heat from the sputtering process for depositing the aluminum film. The wafer temperature in the sputtering process for the Ti film consequently becomes around 170 to 180 degree C. In FIGS. 9A to 9D and FIGS. 10E to 10G, only the barrier metal layer 3 formed on the aluminum interconnect line 2 is illustrated, and another barrier metal layer deposited between the aluminum interconnect line 2 and the SiOx layer 1 is not shown. Next, the TiN film, the aluminum film, the TiN film and the Ti film formed in this order are shaped into a predetermined pattern to form the barrier metal layer (not shown) between the aluminum interconnect line 2 and the SiOx layer 1, the aluminum interconnect line 2 and the barrier metal layer 3 (see FIG. 8, step 102). The film thickness of the TiN layer may be, for example, about 50 nm (500 angstrom), and the film thickness of the Ti layer may be, for example, about 15 to 25 nm (150 to 250 angstrom).

As shown in FIG. 9B, an inter-layer film 4 is then deposited on the SiOx layer 1 so as to cover the aluminum interconnect line 2 and the barrier metal layer 3 (FIG. 8, step 103).

Then, as shown in FIG. 9C, a photo resist (PR) 5 for forming a via hole is formed on the inter-layer film 4 (FIG. 8, step 104).

Then, as shown in FIG. 9D, a via hole 6 is formed by etching the inter-layer film 4 with the photo resist 5 (FIG. 8, step 105). Here, residues 7 generated in the etching process, which are residual matters of the photo resist, the Ti layer or the TiN layer, adhere onto the side walls or the like of the via hole 6 after the etching process is carried out.

Next, as shown in FIG. 10E, a plasma stripping processing is carried out to strip the photo resist 5 (FIG. 8, step 106).

Then, as shown in FIG. 10F, the residues 7 that adhere onto the side wall of the via hole 6 are removed by conducting an organic solvent-stripping processing with a chemical solution for cleaning the formed via hole 6 (FIG. 8, step 107). The organic solvent-stripping processing comprises three steps of: (1) wet-processing with a liquid chemical solution, (2) rinsing with a rinse liquid and (3) drying. Here, carbonated water, which is obtained by dissolving carbon dioxide ($CO_2$) in pure water, is available for the rinse liquid.

Eventually, in order to remove TiOn (titanium oxide) exposing on the bottom of the via hole 6, which is a native oxide of TiN and is formed on the surface of TiN layer of the barrier metal layer 3, the TiN layer is partially eliminated via a radio frequency (RF) sputtering process such that about 10 nm (100 angstrom) in the entire thickness (about 50 nm (500 angstrom)) thereof is eliminated (see FIG. 10G, and FIG. 8, step 108).

Electric coupling of thus formed via hole 6 to the aluminum interconnect line 2 can be obtained by forming an electroconductive material in the via hole 6.

However, the contact resistance that is a resistance of a via often exceeds a criterion, when only a single via is formed corresponding to an aluminum interconnect line having larger area, or when a via hole is formed in the aluminum interconnect line, in which electric charge is structurally accumulated though the aluminum interconnect line does not have larger area. If the contact resistance exceeds the criterion, a failure occurs in the semiconductor device, thereby reducing the production yield.

The reason for increasing the contact resistance in the case of forming the via hole corresponding to the aluminum interconnect line having larger area will be described as follows in reference to FIG. 11.

As shown in FIG. 11, an anode oxidation is caused in the TiN layer of the barrier metal layer 3 disposed on the bottom of the via hole 6 when the aluminum interconnect line 2 is electrically charged, and thus the TiN layer is partially converting into $TiO_2$. Then, a polycrystallization of $TiO_2$ is occurred to create a cubical expansion within $TiO_2$, thereby causing surface cracks on the surface of the barrier metal layer 3. As such, when surface cracks are occurred on the surface of the barrier metal layer 3, the contact area between the electrically conducting material formed in the via hole 6 and the barrier metal layer 3 is diminished, thereby increasing the contact resistance thereof.

It is described in "S .Gwo, C.-L. Yeh, P.-F. Chen, Y.-C. Chou, and T. T. Chen, T.-S. Chao, S.-F. Hu, and T.-Y. Huang, "Local electric-field-induced oxidation of titanium nitride films", APPLIED PHYSICS LETTERS, 22 Feb. 1999, VOLUME 74, NUMBER 8, p.1090–1092" that the thickness of the above-mentioned TiN layer increases by increasing the applied bias voltage. A graph showing the relationship between the thickness of the TiN layer (Height) and the applied bias voltage (Sample Bias) disclosed in the above letter is shown in FIG. 12. As can be seen from the graph shown in FIG. 12, it is found that higher voltage or potential of the accumulated charge within the aluminum interconnect line provides thicker film thickness of the TiN layer via an anodization of TiN.

The aforementioned conventional methods for manufacturing the semiconductor devices involve a problem, in which the electric charge accumulated in the aluminum interconnect line during the formation process of the via hole for coupling to the aluminum interconnect line may cause an increase of the contact resistance thereof such that the manufactured products may be defective products, thereby decreasing the production yield of the semiconductor devices.

SUMMARY OF THE INVENTION

In view of the above situation, the present invention provides a solution to the above-mentioned problem, and it is an object of the present invention to provide a method for manufacturing a semiconductor device, which is capable of reducing the anodization of the TiN layer disposed on the bottom of the via hole during the formation of the via hole for coupling to the aluminum interconnect line to prevent an increase of the contact resistance thereof, thereby improving the production yield thereof.

According to an aspect of the present invention, there is provided a method for manufacturing a semiconductor device, comprising: forming an aluminum film on a semiconductor substrate by a sputtering process; forming a titanium film on the aluminum film by a sputtering process; forming a titanium nitride film on the titanium film by a sputtering process; forming the aluminum film, the titanium film and the titanium nitride film into predetermined patterns; forming an inter-layer film on the titanium nitride film; forming a photo resist having a predetermined pattern on the inter-layer film; partially exposing the titanium nitride film by partially etching the inter-layer film with the photo resist using as a mask to form a via hole; removing the photo resist; and cleaning an interior of the via hole with a liquid chemical solution, wherein the partially exposing the titanium nitride film includes conducting a first nitrogen plasma process after the partially etching the inter-layer firm.

The method for manufacturing the semiconductor device according to the present invention may further comprises conducting a second nitrogen plasma processing after removing the photo resist, wherein the removing the photo resist includes removing the photo resist by conducting a plasma stripping.

The method for manufacturing the semiconductor device according to the present invention may include a configuration, in which the sputtering process is conducted at a temperature within a range of from 200 degree C. to 225 degree C. during the forming the titanium nitride film.

According to another aspect of the present invention, there is provided a method for manufacturing a semiconductor device, comprising: forming an aluminum film on a semiconductor substrate by a sputtering process; forming a titanium film on the aluminum film by a sputtering process; forming a titanium nitride film on the titanium film by a sputtering process; forming the aluminum film, the titanium film and the titanium nitride film into predetermined patterns; forming an inter-layer film on the titanium nitride film; forming a photo resist having a predetermined pattern on the inter-layer film; partially exposing the titanium nitride film by partially etching the inter-layer film with the photo resist using as a mask to form a via hole; removing the photo resist by a plasma stripping; conducting a nitrogen plasma processing after the removing the photo resist; and cleaning an interior of the via hole with a liquid chemical solution.

According to further aspect of the present invention, there is provided a method for manufacturing a semiconductor device, comprising: forming an aluminum film on a semiconductor substrate by a sputtering process; forming a titanium film on the aluminum film by a sputtering process; forming a titanium nitride film on the titanium film by a sputtering process; forming the aluminum film, the titanium film and the titanium nitride film into predetermined patterns; forming an inter-layer film on the titanium nitride film; forming a photo resist having a predetermined pattern on the inter-layer film; partially exposing the titanium nitride film by partially etching the inter-layer film with the photo resist using as a mask to form a via hole; removing the photo resist; and cleaning an interior of the via hole with a liquid chemical solution, wherein the sputtering process is conducted at a temperature within a range of from 200 degree C. to 225 degree C. during the forming the titanium nitride film.

An electric charging accumulated in the processed portion can be prevented by conducting the nitrogen-plasma processing after the etching process. In particular, since this can reduce the electric charge accumulated in the titanium nitride film, the quantity of titanium oxide formed on the bottom of the via hole can be reduced. This can diminish a concern that the contact resistance of the via exceeds the specific value, thereby improving the production yield thereof.

In addition, an accumulation of electric charge in the processed portion can be prevented by conducting a nitrogen-plasma processing after stripping the photo resist via the plasma stripping. This, in turn, can reduce the quantity of electric charge accumulated in the titanium nitride film, thereby further reducing the quantity of titanium oxide formed on the bottom of the via hole.

Here, in the present invention, the temperature of the sputtering process is meant to be a temperature of a substrate (wafer) during the sputtering process. In the operation of forming the titanium film according to the method for manufacturing the semiconductor device of the present invention, the heating process can suitably be controlled so that the sputtering process be conducted at a temperature within the above-described range. As such, the temperature for the sputtering process of the titanium film can be controlled within a predetermined range to provide an improvement in the (111) crystal orientation of the titanium film formed on the titanium nitride film. This can improve the film quality of the titanium nitride film, thereby providing a firmly stable film quality against oxidation.

The method for manufacturing the semiconductor device according to the present invention may further include conducting an irradiation with ultraviolet after the forming the inter-layer film.

The accumulation of electric charge in the irradiated portion can be prevented by conducting the irradiation with ultraviolet after forming the inter-layer film and before forming the photo resist. In particular, since this can reduce the quantity of electric charge accumulated in the titanium nitride film, the quantity of titanium oxide formed on the bottom of the via hole can be reduced. This can inhibit an increase of the contact resistance of the via, thereby improving the production yield thereof.

The method for manufacturing the semiconductor device according to the present invention may further include conducting a rinse for an interior of the via hole with a rinse liquid having a resistivity of equal to or lower than 0.3 MΩ cm after the cleaning the interior of the via hole with the liquid chemical solution.

The operation of cleaning the interior of the via hole with the liquid chemical solution and the operation of conducting the rinse with the rinse liquid are carried out for the purpose of stripping organic compounds adhered onto the side wall of the via hole. The electric charging of the irradiated portion can be prevented by conducting a rinse for an interior of the via hole with a rinse liquid having a resistivity of equal to or lower than 0.3 MΩ cm. In particular, this configuration can reduce the quantity of the electric charge accumulated in the titanium nitride film, so that the quantity of titanium oxide formed on the bottom of the via hole can further be reduced. Therefore, an increase of the contact resistance of the via is inhibited, thereby improving the production yield thereof. Carbonated water containing carbon dioxide ($CO_2$) dissolved in pure water may be employed for the rinse liquid.

The method for manufacturing the semiconductor device according to the present invention may further include eliminating a surface of the titanium nitride film disposed on the bottom of the via hole by radio frequency (RF) sputtering process after the cleaning the interior of the via hole with the liquid chemical solution, 18 nm to 25 nm of the titanium nitride film being sputter-etched by the RF sputtering process.

Having such configuration, titanium oxide formed on the via hole bottom can be effectively removed by suitably controlling the quantity of the stripped titanium oxide via the sputtering process, when the titanium oxide film formed on the bottom of the via hole is stripped, so that an increase of the contact resistance of the via is reduced, thereby improving the production yield.

According to yet another aspect of the present invention, there is provided a semiconductor device, comprising: a semiconductor substrate; an insulating film formed on the semiconductor substrate; a first aluminum interconnect line disposed on the insulating film, the first aluminum interconnect line including a first aluminum film; a first titanium film disposed on the first aluminum film and a first titanium nitride film disposed on the first titanium film, an inter-layer film disposed on the first aluminum interconnect line; and a via disposed in an inter-layer film, the via being electrically coupled to the first aluminum interconnect line, wherein the first titanium nitride film has a region in which the via is disposed, a level of the region being lower than other regions thereof by 13 nm to 30 nm.

As such, a configuration, in which titanium oxide formed on the bottom of the via hole is effectively removed, may be employed, thereby reducing an increase of the contact resistance of the via. In this configuration, the via may have a constitution having a titanium nitride film and tungsten embedded therein.

The semiconductor device according to the present invention may have a configuration, in which the first titanium nitride film has a region in which the via is disposed, a level of the region being lower than other regions thereof by 18 nm to 25 nm.

This configuration can provide inhibiting an increase of the contact resistance of the via more effectively.

According to yet another aspect of the present invention, there is provided a semiconductor device, comprising a semiconductor substrate; an insulating film formed on the semiconductor substrate; a first aluminum interconnect line disposed on the insulating film, the first aluminum interconnect line including a first aluminum film, a first titanium film disposed on the first aluminum film and a first titanium nitride film disposed on the first titanium film; an inter-layer film disposed on the first aluminum interconnect line; and a via disposed in an inter-layer film, the via being electrically coupled to the first aluminum interconnect line, wherein the first titanium nitride film has a region in which the via is disposed, a level of the region being lower than other regions of the first titanium nitride film by 26% to 60% of the thickness of the other regions thereof.

As such, a configuration, in which titanium oxide formed on the bottom of the via hole is effectively removed, may be employed, thereby reducing an increase of the contact resistance of the via. In this configuration, the via may have a constitution having a titanium nitride film and tungsten embedded therein.

The semiconductor device according to the present invention may have a configuration, in which the first titanium nitride film has a region in which the via is disposed, a level of the region being lower than other regions of the first titanium nitride film by 36% to 50% of the thickness of the other regions thereof.

This configuration can provide inhibiting an increase of the contact resistance of the via more effectively.

The semiconductor device according to the present invention may further comprises a second aluminum interconnect line disposed on the semiconductor substrate, the second aluminum interconnect line including a second aluminum film and a second titanium nitride film disposed on the second aluminum film, wherein a crystal orientation of the first titanium nitride film is higher than a crystal orientation of the second titanium nitride film by a percentage of not lower than 20%.

Here, the crystal orientation of the titanium nitride film may be selected to be (111) orientation. The rate of the crystal orientation thereof can be calculated by using a ratio of peak intensities analyzed by employing an X-ray photoelectron spectroscopy (XPS). The firmly stable film quality of the titanium nitride film against oxidation can be obtainable by improving the crystal orientation of the titanium nitride film. Although the second aluminum interconnect line may be coupled to the first aluminum interconnect line through the via, the second aluminum interconnect line may also be one that is not coupled to the first aluminum interconnect line. Since the crystal orientation of the first titanium nitride film being exposed during the process for forming the via hole is higher according to the present invention, the quantity of titanium oxide formed on the bottom of the via hole can be reduced.

According to yet another aspect of the present invention, there is provided a semiconductor device, comprising a semiconductor substrate; an insulating film formed on the semiconductor substrate; a first aluminum interconnect line disposed on the insulating film, the first aluminum interconnect line including a first aluminum film, a first titanium film disposed on the first aluminum film and a first titanium nitride film disposed on the first titanium film, an inter-layer film disposed on the first aluminum interconnect line; a via disposed in an inter-layer film, the via being electrically coupled to the first aluminum interconnect line; and a second aluminum interconnect line disposed on the semiconductor substrate, the second aluminum interconnect line including a second aluminum film and a second titanium nitride film disposed on the second aluminum film, wherein a crystal orientation of the first titanium nitride film is higher than a crystal orientation of the second titanium nitride film by a percentage of not lower than 20%.

According to the present invention, the anodization of TiN layer disposed on the bottom of the via hole can be inhibited to prevent an increase of the contact resistance thereof when a via hole for coupling to the aluminum interconnect line is formed, thereby improving the production yield thereof.

It is to be noted that any arbitrary combination of the above-described structural components and expressions whether directed to a method, an apparatus, or a system and so forth are all effective and are encompassed by the present embodiments.

Moreover, this summary of the invention does not necessarily describe all necessary features so that the invention may also be a sub-combination of these described features.

DETAILED DESCRIPTION OF THE PREFERRED EMBODIMENTS

The invention will now be described based on preferred embodiments which are not intended to limit the scope of the present invention but to exemplify the invention. All of the features and the combinations thereof described in the embodiments are not necessarily essential to the invention.

(First Embodiment)

Figure 1:
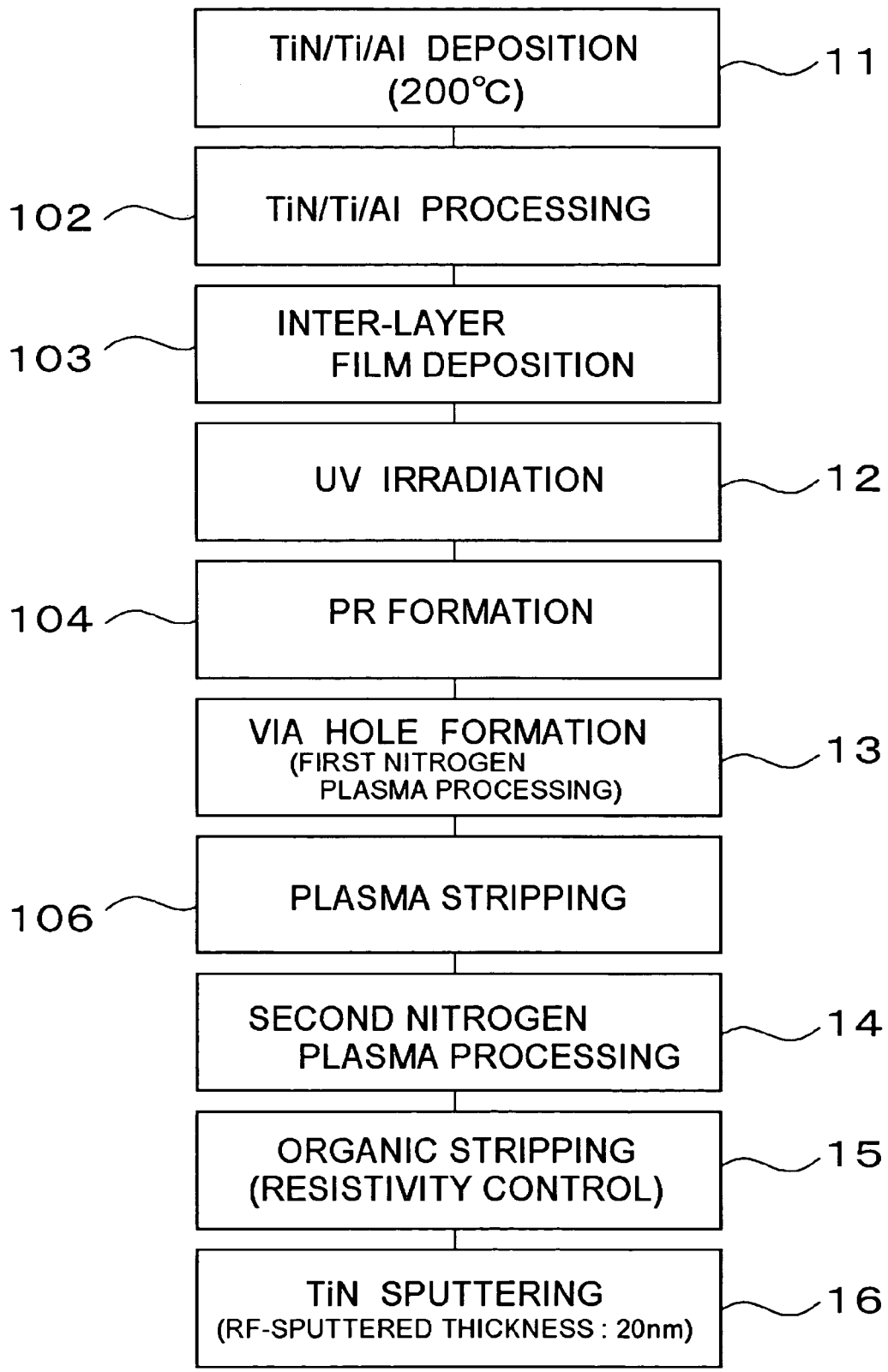
FIG. 1 is a flow chart showing the process for manufacturing the semiconductor device in the first embodiment of the present invention.

FIG. 1 is a flow chart showing the process for manufacturing the semiconductor device in the first embodiment of the present invention. FIGS. 13A to 13C, FIGS. 14D to 14G and FIGS. 15H and 15I are cross sectional views of a semiconductor device, showing steps for manufacturing the semiconductor device according to the present embodiment. Identical numeral numbers appeared in FIG. 1, FIGS. 13A to 13C, FIGS. 14D to 14 G and FIGS. 15H and 15I are employed to indicate the identical steps or components appeared in FIG. 8, FIGS. 9A to 9D and FIGS. 10E to 10G, which illustrate steps of the conventional method for manufacturing the semiconductor device, and therefore related descriptions thereof will be omitted.

Figure 13A:
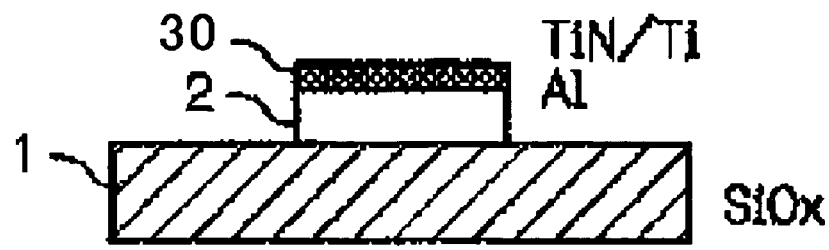
FIGS. 13A to 13C are cross sectional views of the semiconductor device, showing the manufacturing procedure of the semiconductor device in the embodiment of the present invention.

First, as shown in FIG. 13A, a barrier metal layer (not shown) consisting of a titanium (Ti) film and a titanium nitride (TiN) film or another type of barrier metal layer consisting only of a TiN film is formed on an SiOx layer 1, which has been formed on a semiconductor substrate (not shown). Subsequently, an aluminum film, which will be an aluminum interconnect line 2, is deposited on the barrier metal layer. Then, a Ti film and a TiN film (having a film thickness of about 50 nm), which will be a barrier metal layer 30, are consecutively deposited on the aluminum film by a sputtering process (see FIG. 1, step 11). In this embodiment, the sputtering process for depositing the aluminum film for forming the aluminum interconnect line 2 may be carried out at a temperature around 300 to 350 degree C., similarly as in conventional processes. Also in this embodiment, heating process is conducted during the deposition of the Ti film for the barrier metal layer 30 to control the temperature for the sputter apparatus so that the wafer temperature is adjusted to equal to or higher than 200 degree C. The heating manner is different, in this regard, from the heating manner employed in the conventional method for manufacturing the semiconductor device that includes a step of depositing Ti film utilizing remaining heat generated during the deposition of the aluminum film. Although an upper limitation of the temperature for depositing the Ti film is not particularly limited, the temperature may be set to a value of, for example, equal to or lower than 225 degree C. Having such temperature, it helps maintaining the stable condition of the surface of the Ti film when the TiN film is formed after forming the Ti film, thereby inhibiting an increase of the resistance thereof. Here, in FIGS. 13A to 13C, FIGS. 14D to 14G and FIGS. 15H and 15I, only the barrier metal layer 30 formed on the aluminum interconnect line 2 is illustrated, and the barrier metal layer deposited between the aluminum interconnect line 2 and the SiOx layer 1 is not shown.

The Ti film of the barrier metal layer 30 is deposited at a temperature equal to or higher than 200 degree C. in the method for manufacturing the semiconductor device in this embodiment, so that the stabilization of the film quality of the TiN film formed on the Ti film against oxidation can be achieved. This helps inhibiting the oxidization of the TiN film. Here, the sputtering process of the TiN film of the barrier metal layer 30 is carried out by utilizing remaining heat generated in the sputtering process for depositing the Ti film.

Next, the above-described aluminum film, the Ti film and the TiN film are shaped into a predetermined pattern to form the barrier metal layer (not shown) disposed between the aluminum interconnect line 2 and the SiOx layer 1, the aluminum interconnect line 2 and the barrier metal layer 30 (see FIG. 1, step 102).

Figure 13B:
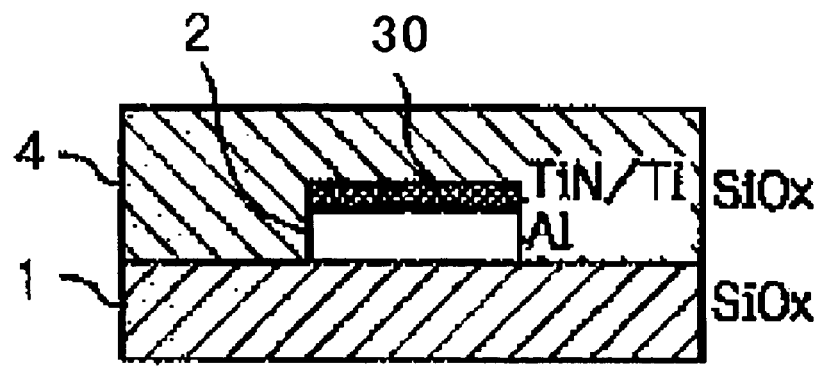

Then, as shown in FIG. 13B, an inter-layer film 4 is deposited on the SiOx layer 1 so as to cover the aluminum interconnect line 2 and the barrier metal layer 30 (see FIG. 1, step 103). After depositing the inter-layer film 4, the entire surface of the inter-layer film 4 is irradiated with ultraviolet (UV). This reduces positive electric charge accumulated within the inter-layer film 4 (see FIG. 1, step 12).

Figure 13C:
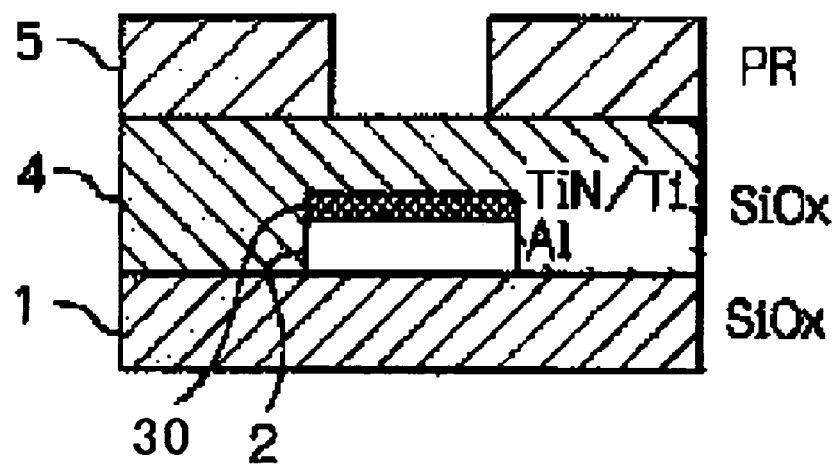

Then, as shown in FIG. 13C, photo resist (PR) 5 having a predetermined pattern is formed on the inter-layer film 4 (FIG. 1, step 104).

Figure 14D:
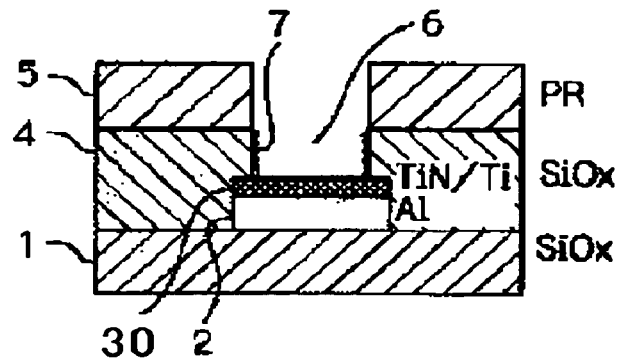
FIGS. 14D to 14G are cross sectional views of the semiconductor device, showing the manufacturing procedure of the semiconductor device in the embodiment of the present invention.
Figure 14E:
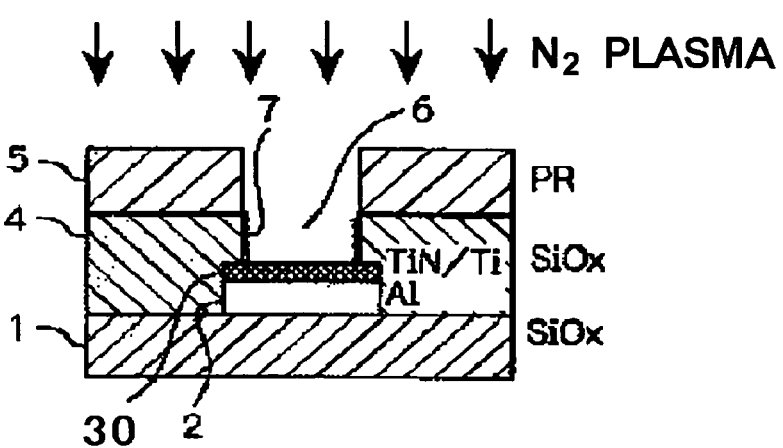
Figure 15H:
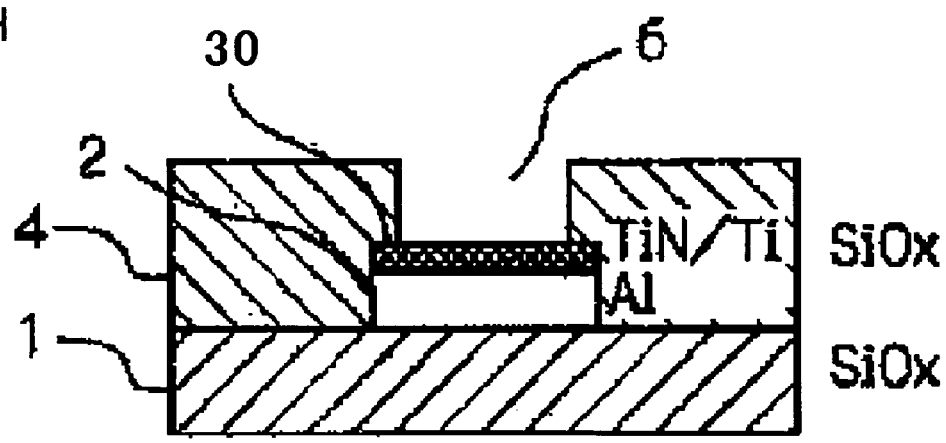
FIGS. 15H and 15I are cross sectional views of the semiconductor device, showing the manufacturing procedure of the semiconductor device in the embodiment of the present invention.
Figure 15I:
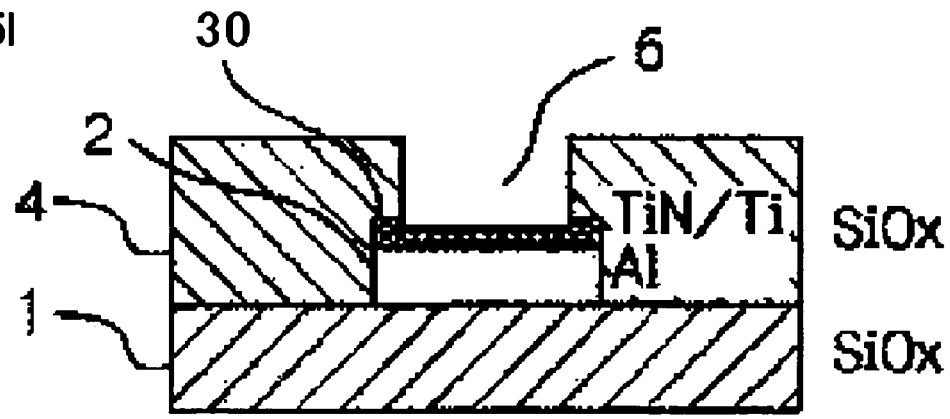

Next, as shown in FIG. 14D, etching process is carried out to form a via hole 6. Nitrogen ($N_2$) plasma processing (a first nitrogen plasma processing) is simultaneously carried out during the etching process in the manufacturing method of this embodiment (FIG. 1, step 13). More specifically, as shown in FIG. 14E, the inter-layer film 4 is dry-etched through the mask of the photo resist 5 to expose the TiN film of the barrier metal layer 30, forming the via hole 6, and thereafter, the nitrogen plasma processing is carried out within the same apparatus. This eliminates the electric charge from the TiN film.

Figure 14F:
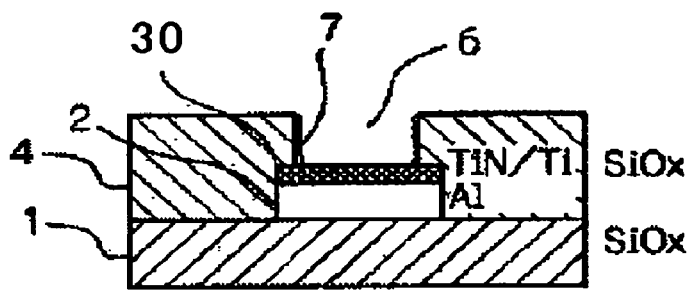

Next, as shown in FIG. 14F, a plasma stripping processing is carried out to strip the photo resist 5 (FIG. 1, step 106).

Figure 14G:
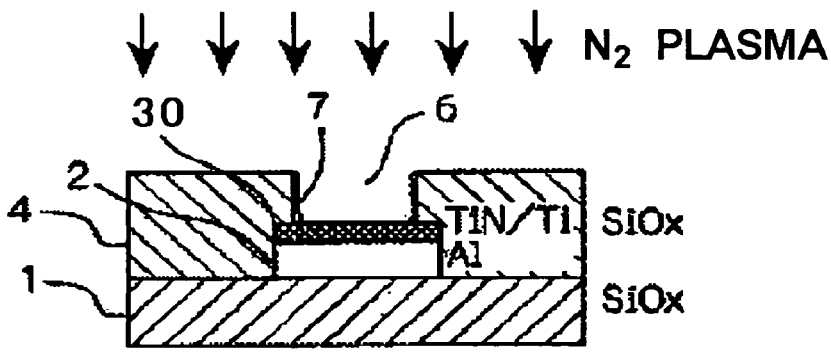

Subsequently, as shown in FIG. 14G, a nitrogen plasma processing is carried out again (a second nitrogen plasma processing) (FIG. 1, step 104). This reduces the positive electric charge accumulated in the TiN film.

Next, as shown in FIG. 15H, an organic solvent-stripping processing is carried out to remove the residues 7 adhered onto the side walls of the via hole 6 (FIG. 1, step 15). An organic solvent-stripping processing includes three steps of: (1) wet processing by a liquid chemical solution; (2) rinsing by a rinse liquid; and (3) drying. In this embodiment, the available rinse liquid of the above (2) step of rinsing may be prepared so that a resistivity thereof may be controlled to be equal to or lower than 0.3 [$M\Omega$ cm]. Such rinse liquid available for this embodiment may be carbonated water containing carbon dioxide ($CO_2$) dissolved in pure water. In this case, the resistivity of the rinse liquid can be controlled by adjusting the quantity of carbon dioxide dissolved in pure water.

Thereafter, as shown in FIG. 15I, the TiN layer of barrier metal layer 30 exposed to the bottom of the via hole 6 is partially eliminated via a radio frequency (RF) sputtering process by a thickness within a range from about 13 nm to 30 nm and more preferably by a thickness within a range from about 18 nm to 25 nm (FIG. 1, step 16). In this embodiment, TiN layer is partially eliminated by about 20 nm thick. Here, the film thickness of TiN of regions other than the bottom of the via hole 6 is about 50 nm. This helps removing TiOn (titanium oxide), which has been generated on the surface of the TiN layer disposed on the bottom of the via hole 6.

Thereafter, a barrier metal (TiN) is formed in the via hole 6 by spatter processing, and after that, tungsten (W) is grown by a chemical vapor deposition (CVD). Thereafter, a chemical mechanical polishing (CMP) is carried out until SiOx of the inter-layer film 4 is exposed. Eventually, the via is formed.

Figure 16:
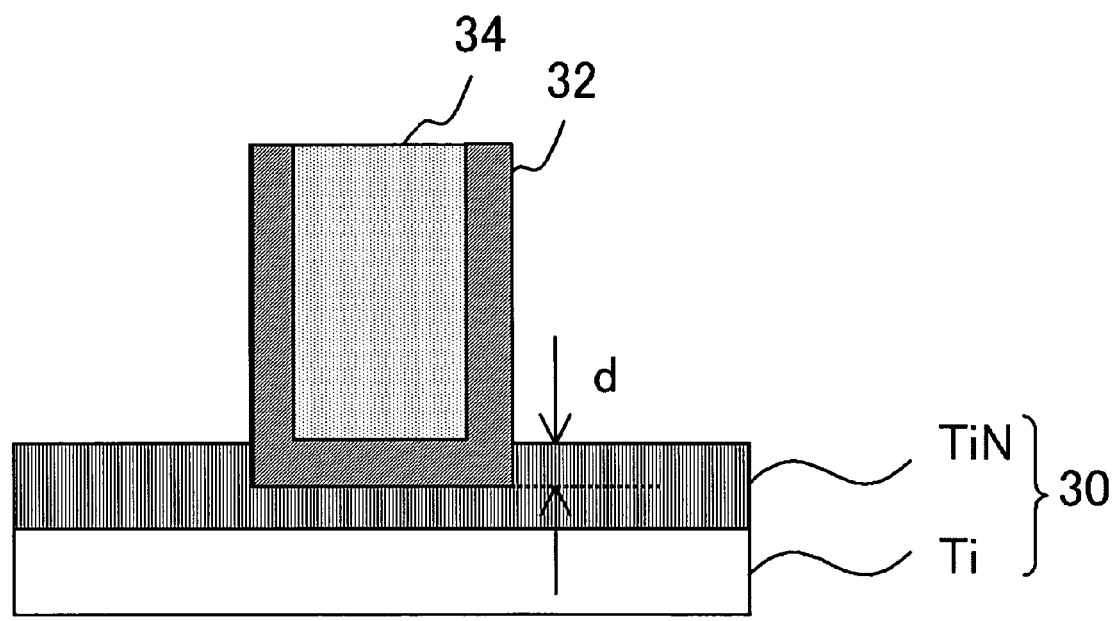
FIG. 16 is a cross sectional view showing the constitution of the bottom of the via in detail.

FIG. 16 is a cross sectional view showing the constitution of the via bottom in detail.

The TiN film of the barrier metal layer 30 has a region, in which the via (a TiN film 32 and a W plug 34) is formed, and a top surface of the region is lower than that of other regions of the TiN film by a height or thickness d. Here, the film thickness of the TiN film in the other region may be, for example, 50 nm. In this case, the height or the thickness d may be within a range of 13 nm to 30 nm, and more preferably within a range of 18 nm to 25 nm.

(Second Embodiment)

Figure 17:
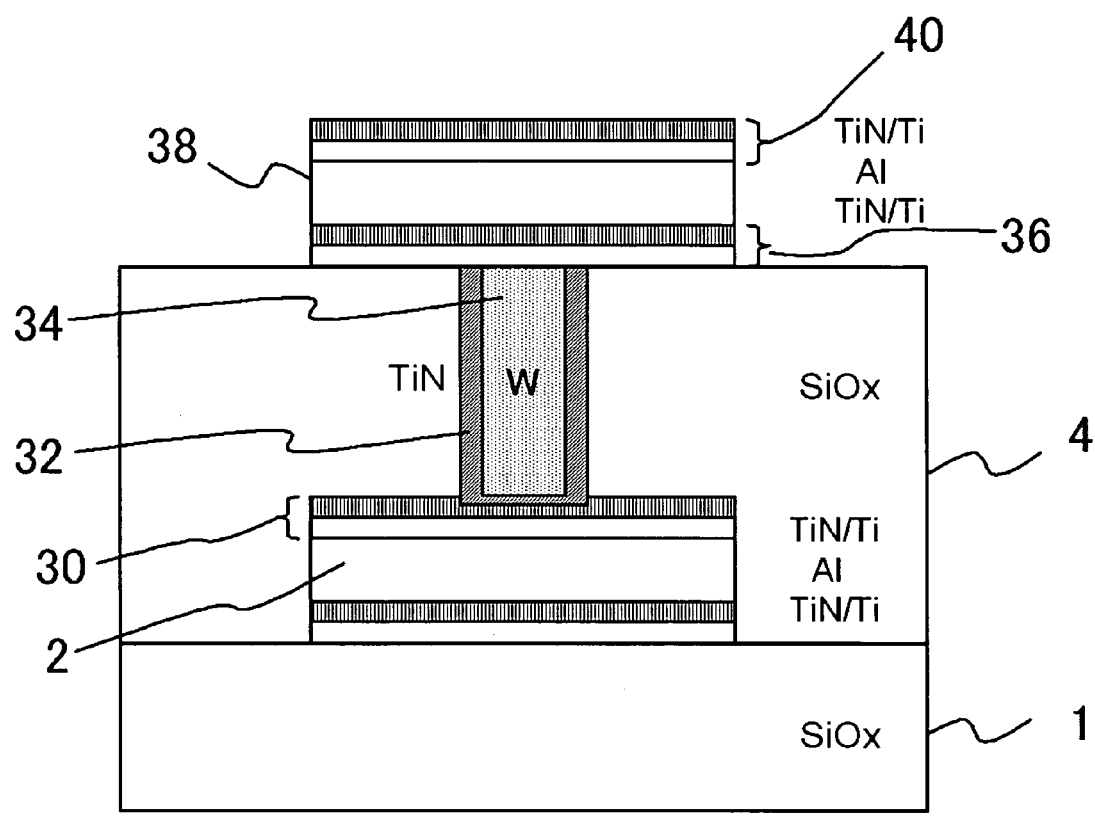
FIG. 17 is a cross sectional view showing the constitution of the semiconductor device in one embodiment of the present invention.

FIG. 17 is a cross sectional view showing a constitution of a semiconductor device according to this embodiment.

In this embodiment, the semiconductor device has a constitution, in which a via is formed in a via hole 6 by the similar procedure as employed in the first embodiment described in reference to FIGS. 13A to 13C, FIGS. 14D to 14G, FIGS. 15H and 15I and FIG. 16, and which further comprises a second aluminum interconnect line 38 formed thereon.

After forming the via, a Ti film and a TiN film, which will be a barrier metal layer 36, are deposited on the via and the inter-layer film 4 by a sputtering process. Subsequently, an aluminum film for forming an aluminum interconnect line 38 is deposited on the barrier metal layer 36. Thereafter, a Ti film and a TiN film for forming the barrier metal layer 40 are deposited on the aluminum film by a sputtering process. In this case, the sputtering process for depositing the aluminum film for forming the aluminum interconnect line 38 may be conducted at a temperature around 300 to 350 degree C., similarly as in the formation of the aluminum film 2. In this embodiment, the Ti film of the barrier metal layer 40 is grown by utilizing the remaining heat generated by the process for depositing the aluminum film.

EXAMPLES

The production yield rate was improved up to nearly 100% according to the method for manufacturing the semiconductor device in this embodiment from about 20% for a conventional manufacturing method, by carrying out the various processing steps that has been described above.

Each of the specific effect obtained from each of the countermeasures will be described as follows in reference to FIG. 2 to FIG. 7. In the following description, the production yield is meant to be a rate of via holes that are inspected and classified as non-defective, and the non-defective via holes were classified in the inspection when a resistance per one via hole was within a specific range.

Example 1

Figure 2:
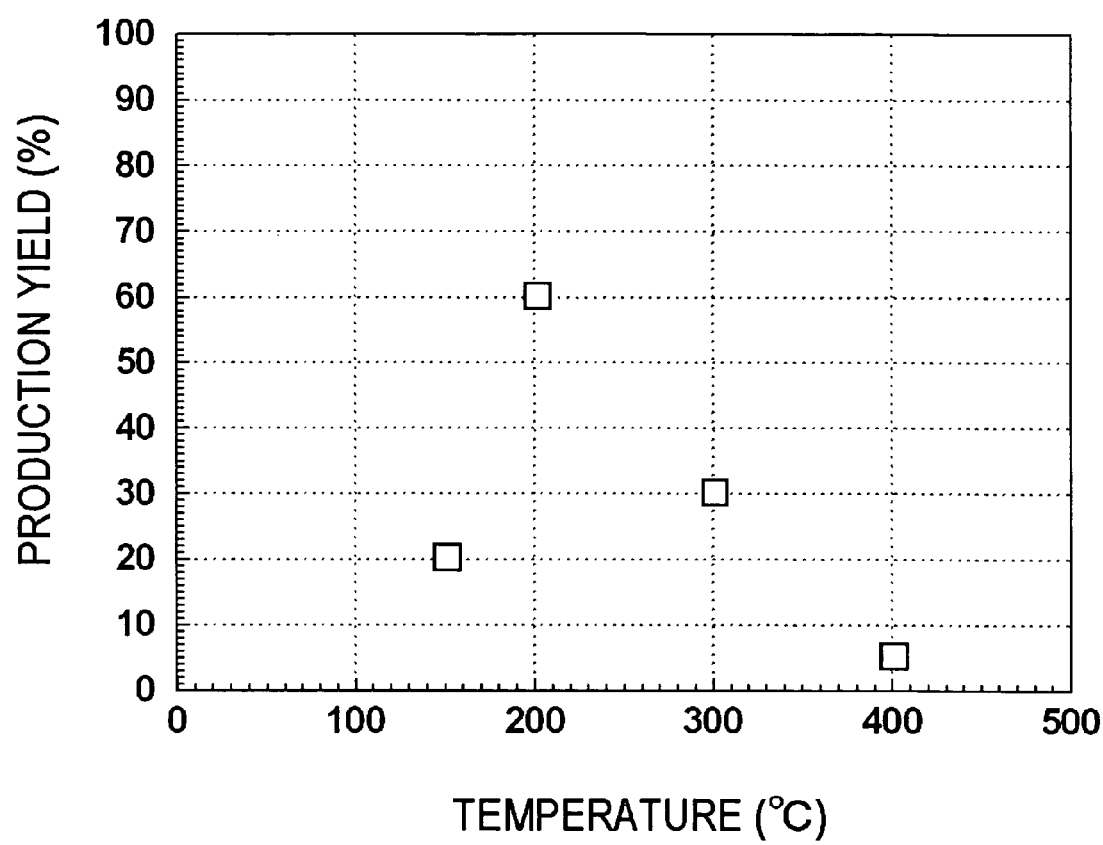
FIG. 2 is a graph showing a relationship of the temperature for depositing the Ti film with the production yield, indicating the temperature dependency of the Ti sputtering.

Relationship between the temperature for depositing the Ti film and the production yield is shown in FIG. 2.

Since the conventional sputtering process for the Ti film in the conventional manufacturing method is generally carried out by utilizing remaining heat that has been generated in the sputtering process for the aluminum interconnect line, it is estimated that the wafer temperature for conducting the sputtering process for the Ti film should be around 170 to 180 degree C. Therefore, a comparative example of conducting a sputtering process for the Ti film at a temperature of about 170 to 180 degree C. was additionally carried out and the production yield of the comparative example (20%) was additionally employed.

In addition, the production yields in cases of conducting sputtering process for forming Ti films at respective temperatures of 200 degree C., 300 degree C. and 400 degree were also obtained.

As can be seen from FIG. 2, the production yields were improved by up to about 50% when the temperatures of the sputtering process for forming the Ti film for the barrier metal layer were set to a temperature within a range of from 200 degree C. to 225 degree C. It is also found in the figure that the production yields were deteriorated when the temperatures for depositing the Ti films were set to a temperature of 300 degree C. or 400 degree C., because the resistance thereof increases due to roughening of the surface of the TiN film.

Example 2

Respective advantageous effects obtainable in respective cases of: (1) when the step of irradiating UV, shown as "step 12" in FIG. 1, was additionally included; (2) when the step of conducting a nitrogen plasma processing, shown as "step 13" in FIG. 1, was additionally included; or (3) when the step of conducting a second nitrogen plasma processing, shown as "step 14" in FIG. 1, was additionally included, are shown in FIG. 3.

In addition, the result of the case of forming the via hole by having no additional steps of the above-described steps (1) to (3) (indicating "none" in the graph) is also shown.

Figure 3:
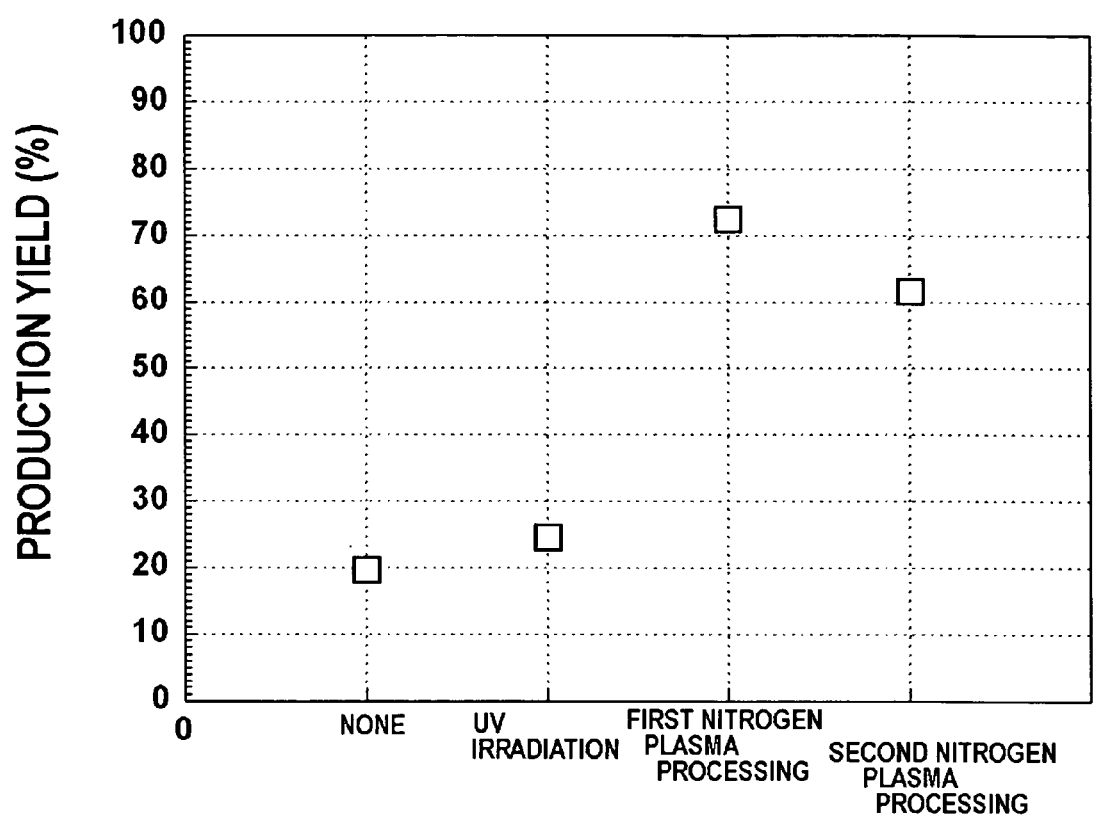
FIG. 3 is a graph showing advantageous effects by conducting UV irradiation and nitrogen plasma processing.

As can be seen from FIG. 3, oxidation of the TiN film was inhibited by conducting the first nitrogen plasma processing or the second nitrogen plasma processing during the formation of the via hole to reduce positive electric charge accumulated in the TiN film, thereby significantly improving the production yield. In addition, it is also found that the production yield was improved by conducting the UV irradiation as compared with the case of having no UV irradiation.

Figure 4:
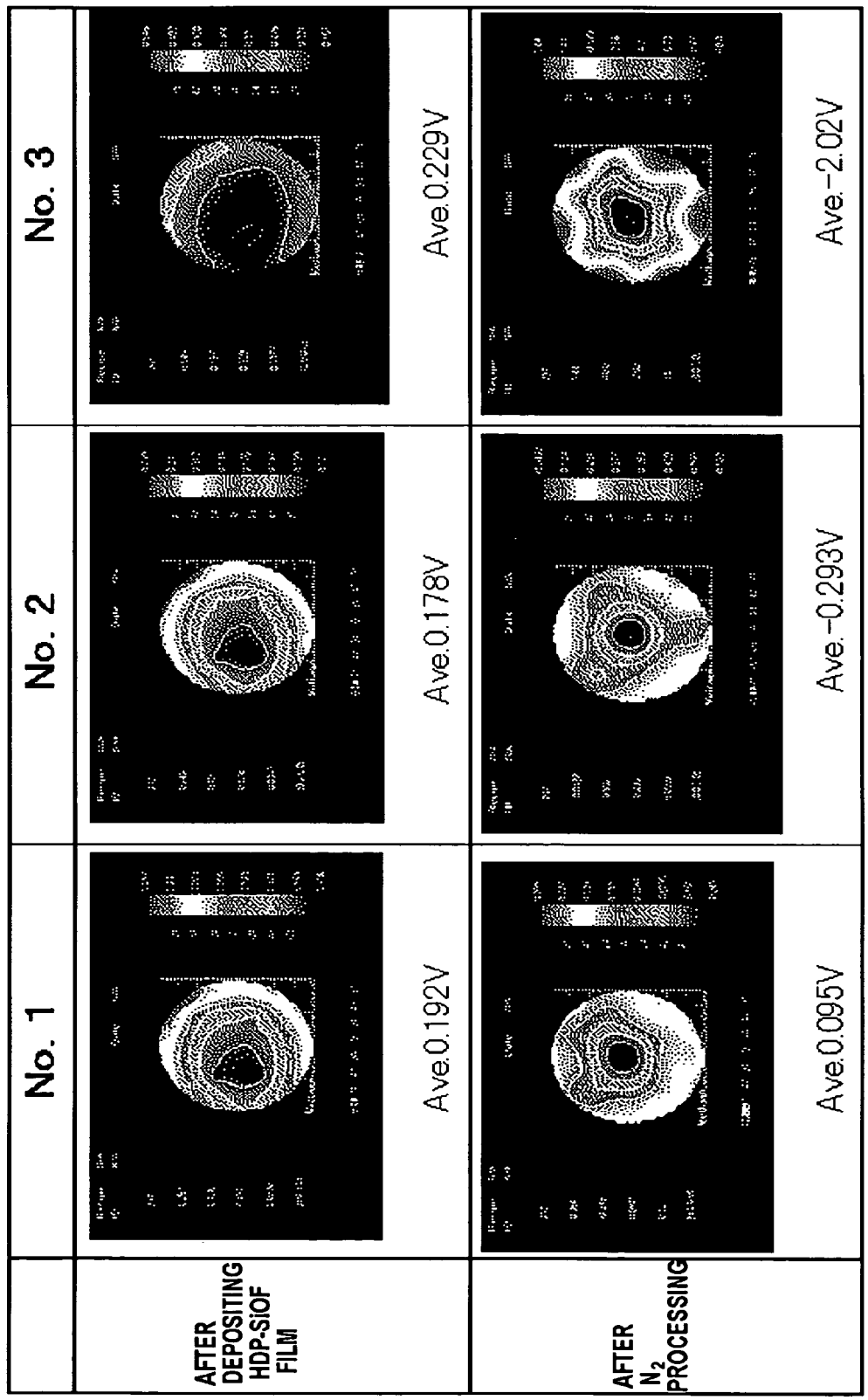
FIG. 4 includes photographs showing the status of changing the surface charge distribution of a wafer by conducting a nitrogen plasma processing.

FIG. 4 includes photographs showing the status of changing the surface charge distribution of three wafer samples No. 1 to No. 3 by conducting a nitrogen plasma processing to these wafers. The upper row of FIG. 4 includes photographs showing the electric charge distributions of the surfaces of wafers after depositing inter-layer films, and the lower row of FIG. 4 includes photographs showing the electric charge distributions of the surfaces of wafers after conducting the nitrogen plasma processing.

It can be understood from FIG. 4 that electric potential on the wafer surface, which had been positively charged just after depositing the inter-layer film thereon, decreased by conducting the nitrogen plasma processing. As such, a positive electric charge in the processed region can be reduced by conducting the nitrogen plasma processing.

Example 3

Figure 5:
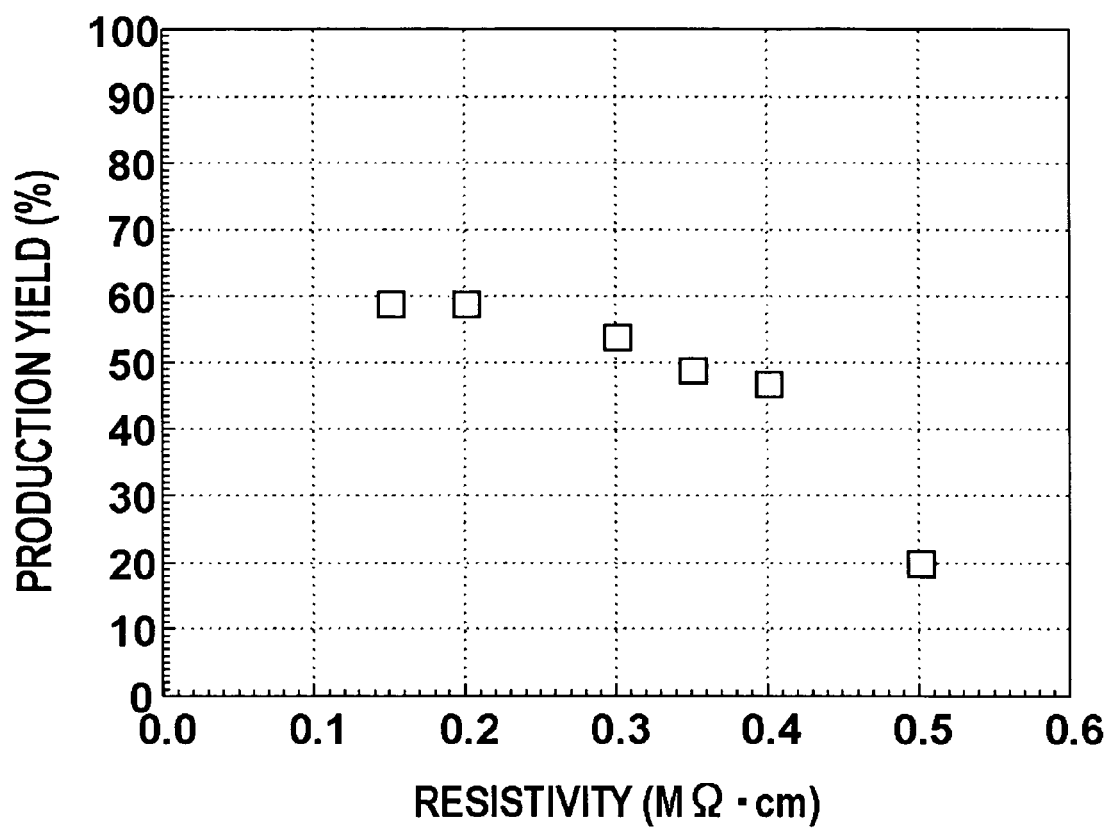
FIG. 5 is a graph showing the relationship between the resistivity of a rinse liquid and the production yields, indicating the dependency by the resistivity of pure water.

FIG. 5 is a graph showing the relationship between the resistivity of a rinse liquid during the rinse processing using the rinse liquid in the organic solvent-stripping processing and the production yields of the obtained products, shown as step 15 of FIG. 1. The resistivities of the rinse liquids were adjusted to obtain 0.15, 0.2, 0.3, 0.35, 0.4 or 0.5 [MΩ cm], respectively, and the cleaning processes with the respective rinse liquids were conducted. The resistivities of the rinse liquids were adjusted by selecting the quantity of carbon dioxide dissolved in pure water.

As can be seen from FIG. 5, the production yield was improved by controlling the resistivity of the rinse liquid to equal to or lower than 0.3 [MΩ cm]. Although the lower limit of the resistivity of the rinse liquid is not particularly limited, the resistivity may be adjusted to, for example, 0.01 [MΩ cm].

Example 4

Figure 6:
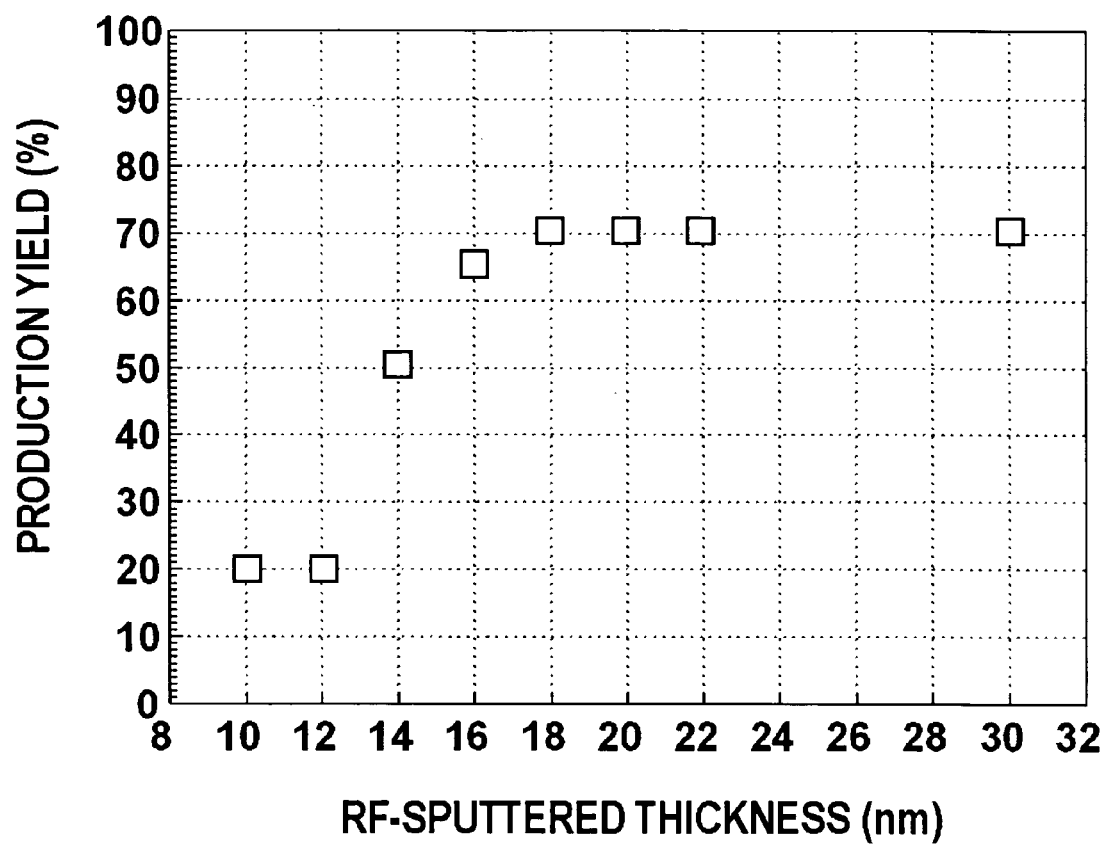
FIG. 6 is a graph showing relationships of the RF-spattered thickness and the production yields, indicating of the dependency on the RF-spattered thickness.

FIG. 6 is a graph showing relationships between the RF-spattered thickness during the RF sputtering processes for the TiN film disposed on the bottom of the via hole in the step 16 of FIG. 1 and the production yields of the resultant products. In this example, the production yields were obtained for the cases of: the RF-spattered thickness was 10 nm (the RF-spattered thickness was 20% of the non-sputtered film thickness); 12 nm (24%); 14 nm (28%); 16 nm (32%); 18 nm (36%); 20 nm (40%); 22 nm (44%); and 30 nm (60%).

As can be seen from FIG. 6, the production yields improved by increasing the RF-spattered thickness. In particular, the production yields improved by having the RF-spattered thicknesses of equal to or larger than 13 nm, and more preferably equal to or larger than 18 nm. Although the upper limitation of the RF-spattered thickness is not particularly limited, the RF-spattered thickness may be, for example, equal to or lower than 30 nm, and more preferably equal to or lower than 25 nm. This helps effectively removing titanium oxide from the semiconductor device having various types of interconnect patterns formed therein, without, for example, adversely affecting other layers such as the underlying aluminum interconnect lines.

Example 5

Figure 7:
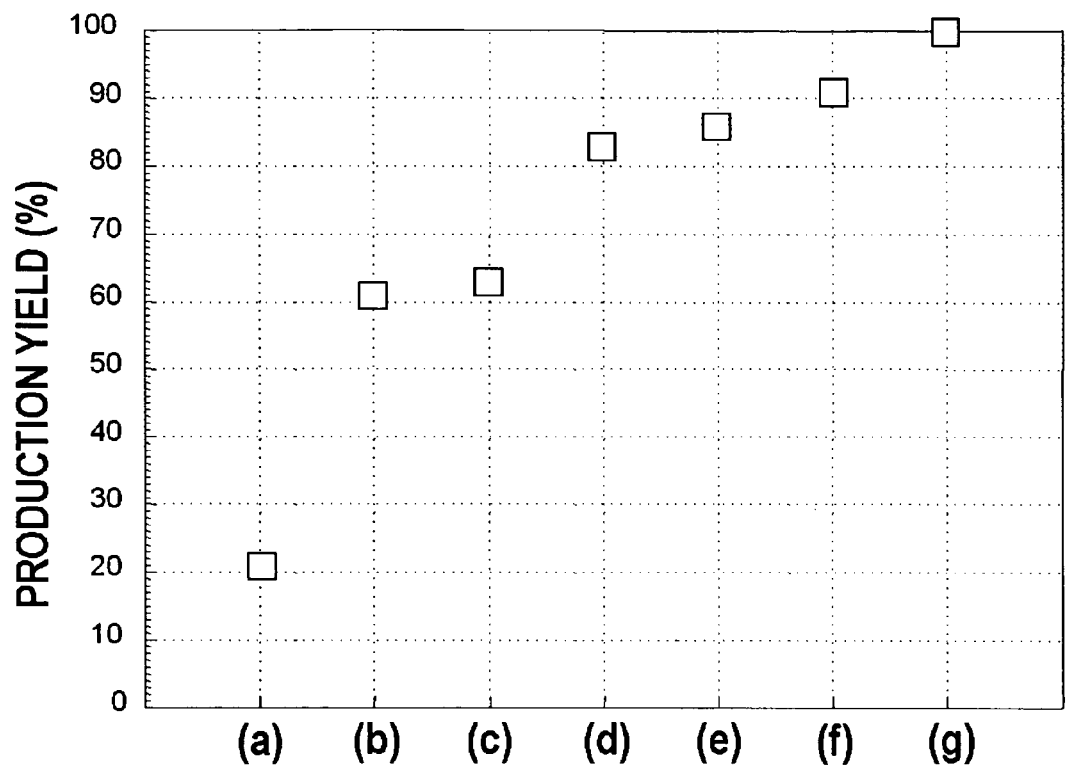
FIG. 7 is a graph showing advantageous effects by conducting various countermeasures.
Figure 8:
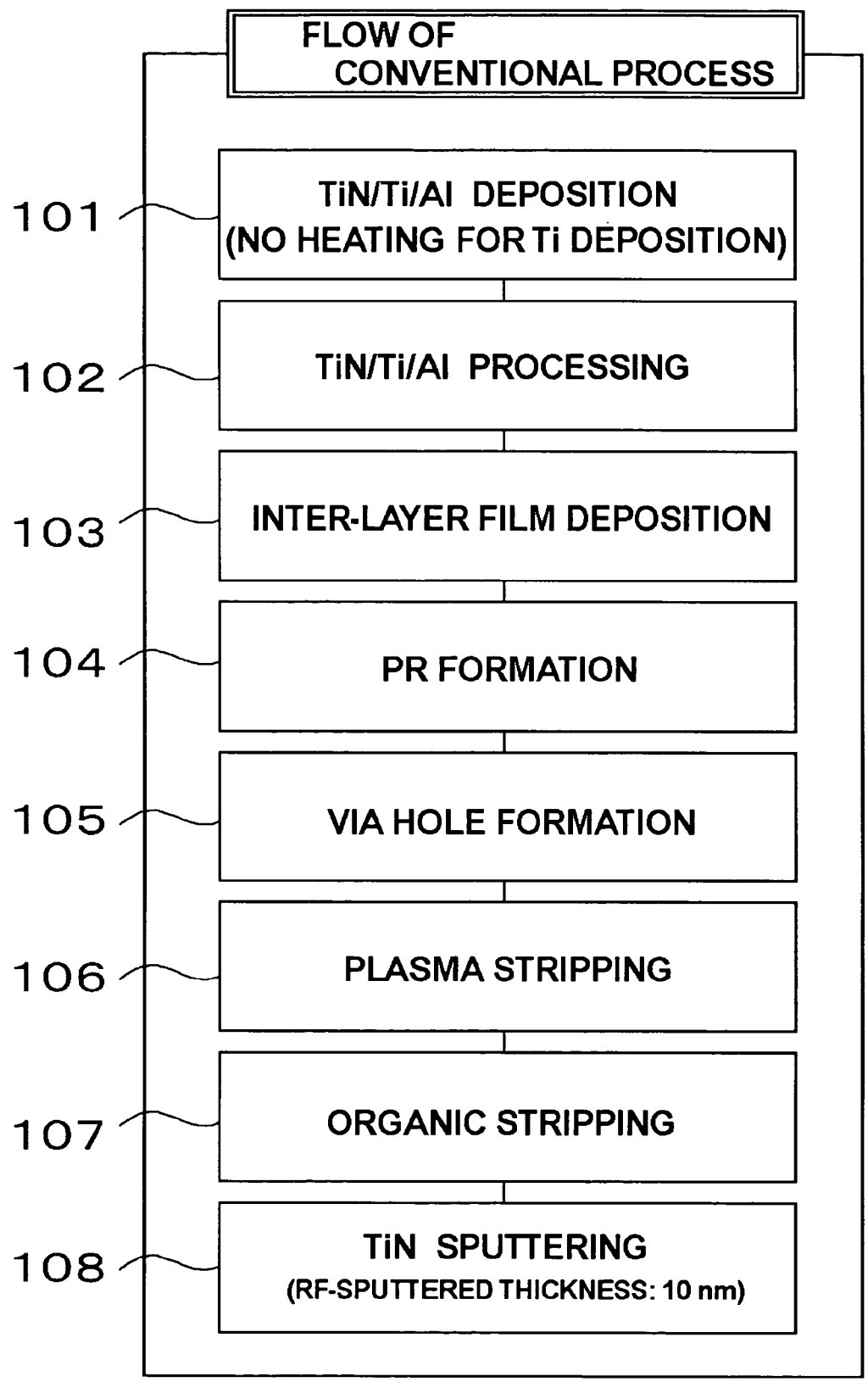
FIG. 8 is a flow chart showing the manufacturing process of the conventional semiconductor device.
Figure 9A:
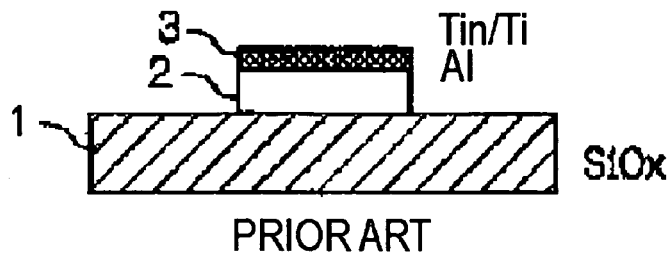
FIGS. 9A to 9D are cross sectional views, showing the process for forming a via hole.
Figure 9B:
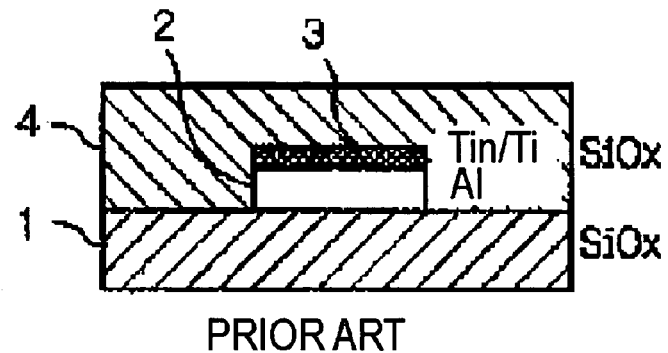
Figure 9C:
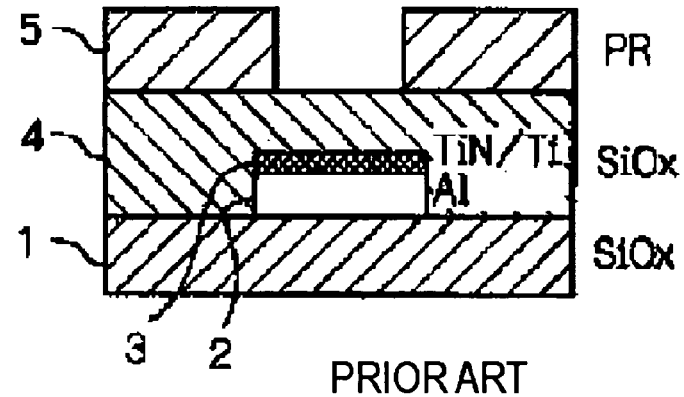
Figure 9D:
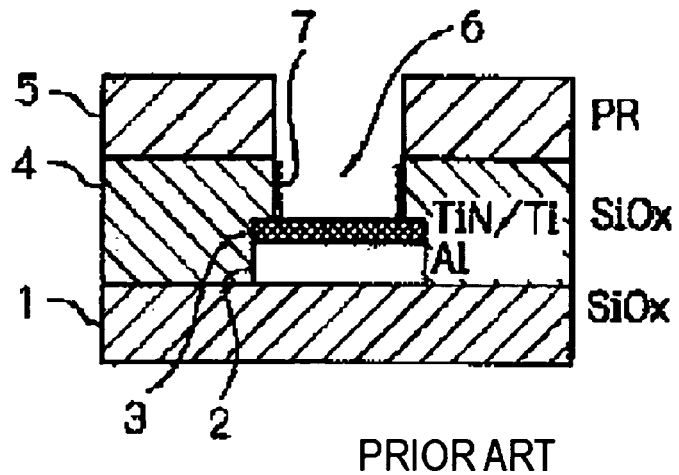
Figure 10E:
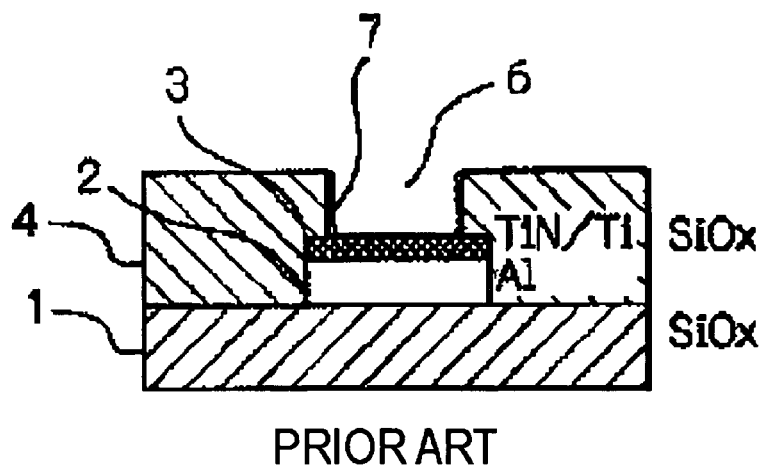
FIGS. 10E to 10G are cross sectional views, showing the process for forming a via hole.
Figure 10F:
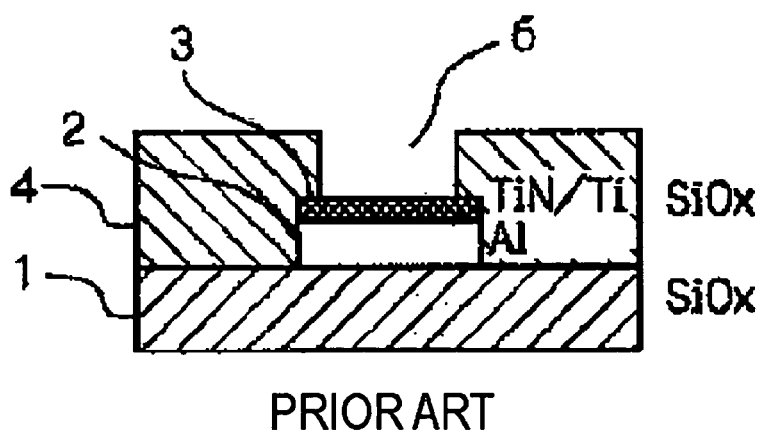
Figure 10G:
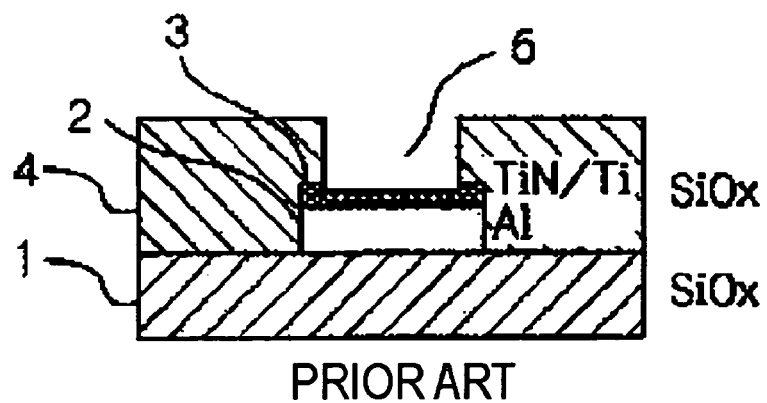
Figure 11:
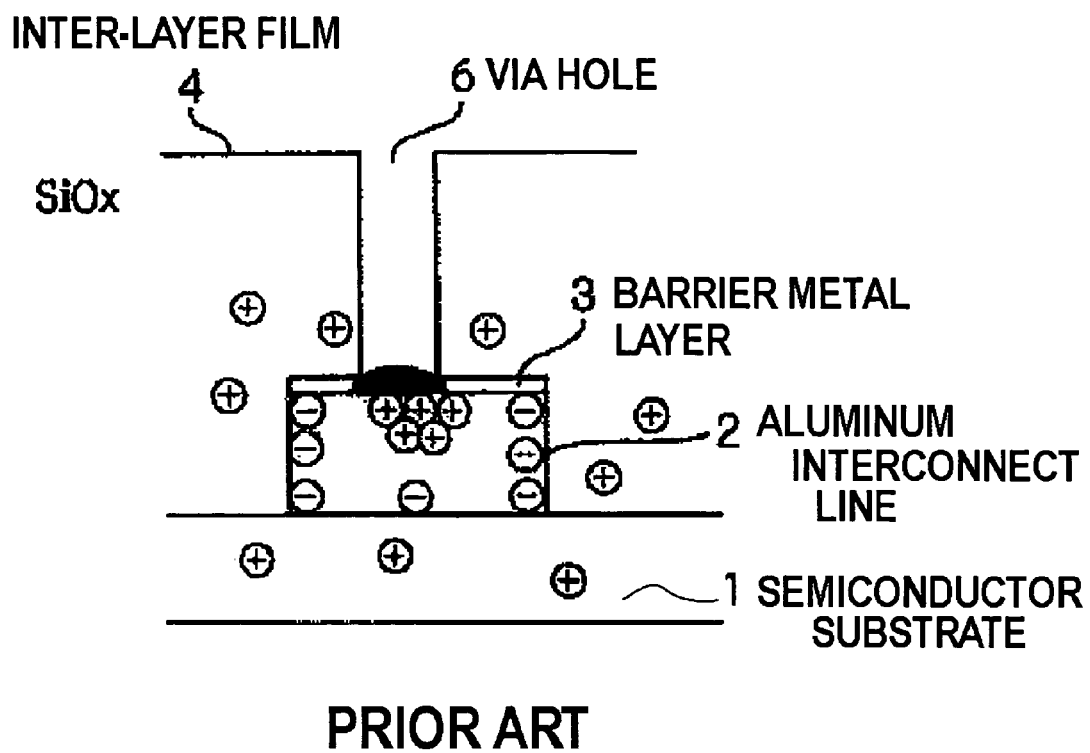
FIG. 11 is a schematic cross sectional view, illustrating the mechanism for increasing the contact resistance.
Figure 12:
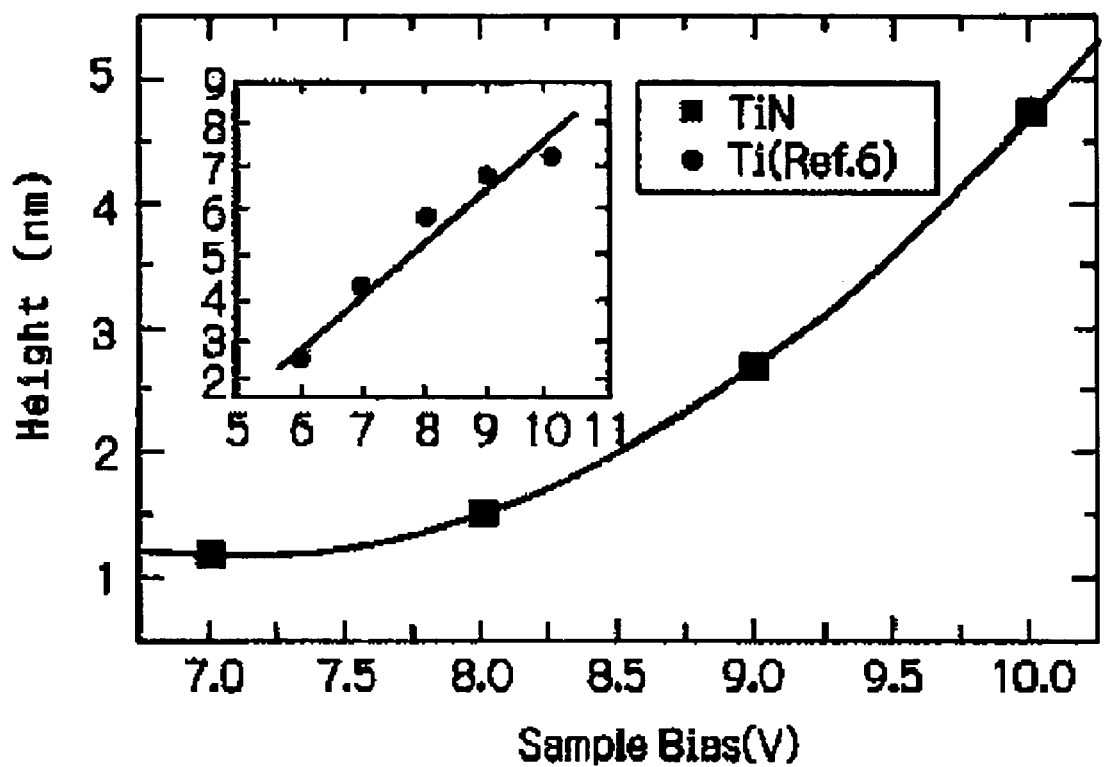
FIG. 12 is a graph showing the relationship of the thickness of TiN layer (Height) with the applied bias voltage (Sample Bias).

FIG. 7 is a graph showing the advantageous effects obtained by sequentially adding respective countermeasures stated above. FIG. 7 includes the results obtained by the processes of:

(1): forming the via holes by the conventional manufacturing method (without any countermeasures described above);

(2): depositing the TiN film via the sputtering process at a temperature of 200 degree C.;

(3): irradiating thereto with UV, in addition to the above (2);

(4): conducting the first nitrogen plasma processing thereto during the etching process for the via holes, in addition to the above (3);

(5): conducting the second nitrogen plasma processing thereto after the plasma stripping, in addition to the above (4);

(6): controlling the resistivity of the rinse liquid used in the organic stripping processing to equal to or lower than 0.3 [MΩ cm], in addition to (5); and (7): sputtering thereof to achieve the RF-spattered thickness of 20 nm, in addition to (6).

It should be noted that all the countermeasures described above were included in the process of the above (7).

As can be seen from FIG. 7, nearly 100% of the production yield was obtained by including all the countermeasures described above. In addition, it is also found in this graph that equal to or higher than 80% of the production yield is obtainable by including only three countermeasures, which are: (a) setting the temperature for depositing the Ti film to 200 degree C. to 225 degree C.; (b) conducting the nitrogen plasma processing during the via hole formation; and (c) conducting the nitrogen plasma processing after the plasma stripping. The production yield rate can significantly be improved according to the method for manufacturing the semiconductor device of this embodiment from about 20% in a conventional manufacturing method.

Example 6

Figure 18:
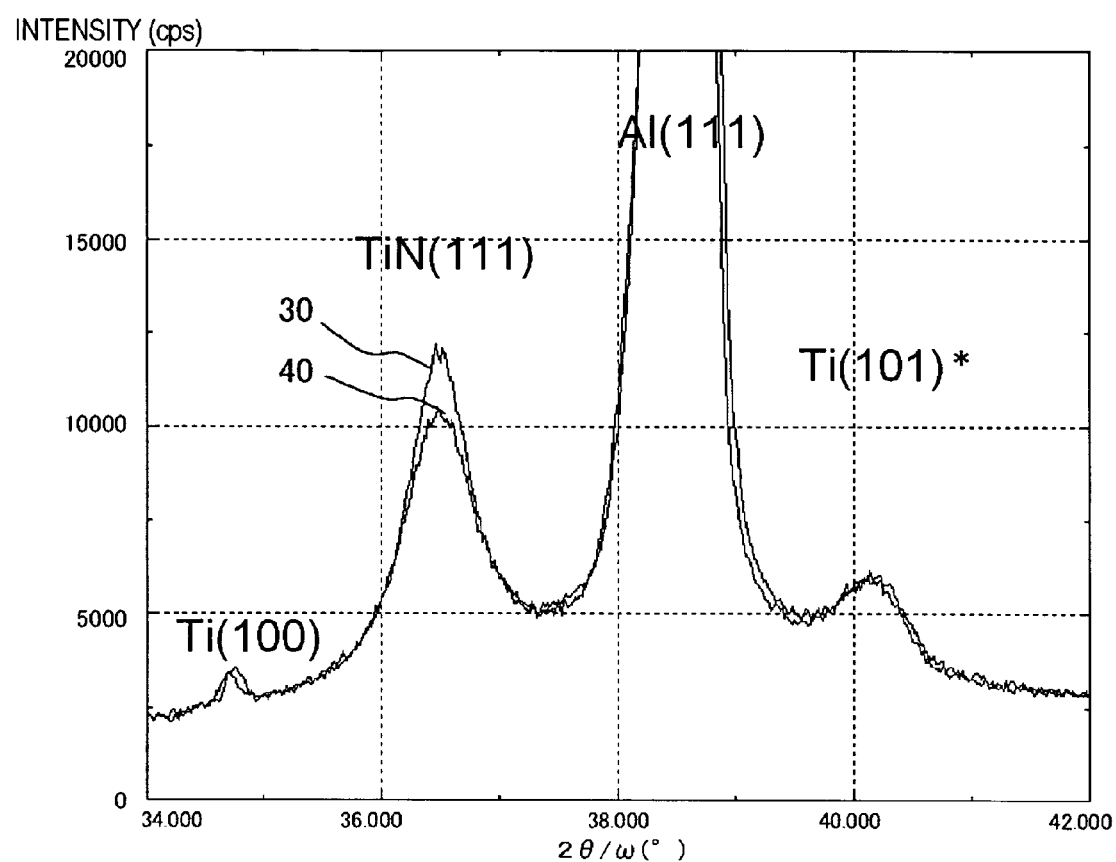
FIG. 18 is a chart of the X-ray photoelectron spectroscopy (XPS) analysis, showing the results analyzed (111) orientation of the TiN film.

A semiconductor device was manufactured in a similar method as described in the second embodiment. Heating process was included in the deposition of the Ti film for the barrier metal layer 30, and the Ti film was formed at a temperature of about 200 degree C. Another Ti film for another barrier metal layer 40 was deposited by utilizing remaining heat that had been generated in the process for depositing an aluminum film (38). The results analyzed by employing an X-ray photoelectron spectroscopy (XPS) for (111) orientation of the TiN film of the barrier metal layer 30 and (111) orientation of the TiN film of the barrier metal layer 40 are shown in FIG. 18. As can be seen from the peak intensities appeared in the chart, it is indicated that (111) orientation of the TiN film of the barrier metal layer 30 is higher by 20% than (111) orientation of the TiN film of the barrier metal layer 40.

Although the present invention has been described in reference to the preferred forms with a certain degree of particularly illustrated in the annexed figures, it should be understood that the present disclosure is presented for the illustration only, and other various configurations may be employed without departing from the spirit and the scope of the invention.

For example, although the present invention has been described in relation to the configuration of employing SiOx for the inter-layer film 4 in the above embodiments, a person having ordinary skills in the art would appreciate that the present invention is not limited thereto, and the inter-layer film 4 may be formed by employing other materials such as SiOF.

In addition, although the present invention has been described in relation to the configuration of employing the aluminum interconnect line, copper may additionally be contained in the aluminum interconnect line.

What is claimed is:

1. A method for manufacturing a semiconductor device, comprising:
   forming an aluminum film on a semiconductor substrate by a sputtering process;
   forming a titanium film on said aluminum film by a sputtering process;
   forming a titanium nitride film on said titanium film by a sputtering process;
   forming said aluminum film, said titanium film and said titanium nitride film into predetermined patterns;
   forming an inter-layer film on said titanium nitride film;
   forming a photo resist having a predetermined pattern on said inter-layer film;
   partially exposing said titanium nitride film by partially etching said inter-layer film with said photo resist used as a mask to form a via hole;
   removing said photo resist; and
   cleaning an interior of said via hole with a liquid chemical solution,
   wherein said partially exposing said titanium nitride film includes conducting a first nitrogen plasma process after said partially etching said inter-layer film.

2. The method according to claim 1, further comprising:
   conducting a second nitrogen plasma processing after removing said photo resist,
   wherein said removing said photo resist includes removing said photo resist by conducting a plasma stripping.

3. The method according to claim 1, wherein said sputtering process is conducted at a temperature within a range of from 200 degree C. to 225 degree C. during said forming said titanium nitride film.

4. The method according to claim 2, wherein said sputtering process is conducted at a temperature within a range of from 200 degree C. to 225 degree C. during said forming said titanium nitride film.

5. A method for manufacturing a semiconductor device, comprising:
   forming an aluminum film on a semiconductor substrate by a sputtering process;
   forming a titanium film on said aluminum film by a sputtering process;
   forming a titanium nitride film on said titanium film by a sputtering process;
   forming said aluminum film, said titanium film and said titanium nitride film into predetermined patterns;
   forming an inter-layer film on said titanium nitride film;
   forming a photo resist having a predetermined pattern on said inter-layer film;
   partially exposing said titanium nitride film by partially etching said inter-layer film with said photo resist used as a mask and conducting a first nitrogen plasma processing to form a via hole;
   removing said photo resist by a plasma stripping;
   conducting a second nitrogen plasma processing after said removing said photo resist; and
   cleaning an interior of said via hole with a liquid chemical solution.

6. A method for manufacturing a semiconductor device, comprising:
   forming an aluminum film on a semiconductor substrate by a sputtering process;
   forming a titanium film on said aluminum film by a sputtering process;
   forming a titanium nitride film on said titanium film by a sputtering process;
   forming said aluminum film, said titanium film and said titanium nitride film into predetermined patterns;
   forming an inter-layer film on said titanium nitride film;
   forming a photo resist having a predetermined pattern on said inter-layer film;
   partially exposing said titanium nitride film by partially etching said inter-layer film with said photo resist used as a mask to form a via hole;
   removing said photo resist; and
   cleaning an interior of said via hole with a liquid chemical solution,
   wherein said sputtering process is conducted at a temperature within a range of from 200 degree C. to 225 degree C. during said forming said titanium nitride film.

7. The method according to claim 1, further comprising conducting an irradiation with ultraviolet after said forming said inter-layer film.

8. The method according to claim 4, further comprising conducting an irradiation with ultraviolet after said forming said inter-layer film.

9. The method according to claim 5, further comprising conducting an irradiation with ultraviolet after said forming said inter-layer film.

10. The method according to claim 6, further comprising conducting an irradiation with ultraviolet after said forming said inter-layer film.

11. The method according to claim 1, further comprising conducting a rinse for an interior of said via hole with a rinse liquid having a resistivity of equal to or lower than 0.3 MΩ cm after said cleaning the interior of said via hole with the liquid chemical solution.

12. The method according to claim 5, further comprising conducting a rinse for an interior of said via hole with a rinse liquid having a resistivity of equal to or lower than 0.3 MΩ cm after said cleaning the interior of said via hole with the liquid chemical solution.

13. The method according to claim 6, further comprising conducting a rinse for an interior of said via hole with a rinse liquid having a resistivity of equal to or lower than 0.3 MΩ cm after said cleaning the interior of said via hole with the liquid chemical solution.

14. The method according to claim 8, further comprising conducting a rinse for an interior of said via hole with a rinse liquid having a resistivity of equal to or lower than 0.3 MΩ cm after said cleaning the interior of said via hole with the liquid chemical solution.

15. The method according to claim 1, further comprising eliminating a surface of said titanium nitride film disposed on the bottom of said via hole by radio frequency (RF) sputtering process after said cleaning the interior of said via hole with the liquid chemical solution, 18 nm to 25 nm of said titanium nitride film being sputter-etched by said RF sputtering process.

16. The method according to claim 5, further comprising eliminating a surface of said titanium nitride film disposed on the bottom of said via hole by radio frequency (RF) sputtering process after said cleaning the interior of said via hole with the liquid chemical solution, 18 nm to 25 nm of said titanium nitride film being sputter-etched by said RF sputtering process.

17. The method according to claim 6, further comprising eliminating a surface of said titanium nitride film disposed on the bottom of said via hole by radio frequency (RF) sputtering process after said cleaning the interior of said via hole with the liquid chemical solution, 18 nm to 25 nm of said titanium nitride film being sputter-etched by said RF sputtering process.

18. The method according to claim 14, further comprising eliminating a surface of said titanium nitride film disposed on the bottom of said via hole by radio frequency (RF) sputtering process after said cleaning the interior of said via hole with the liquid chemical solution, 18 nm to 25 nm of said titanium nitride film being sputter-etched by said RF sputtering process.

19. The method according to claim 5, further comprising:
a heating process during said forming a titanium film.

20. The method according to claim 6, further comprising:
a heating process during said forming a titanium film.

21. A method for manufacturing a semiconductor device, comprising:
forming an aluminum film on a semiconductor substrate;
forming a titanium film on said aluminum film;
forming a titanium nitride film on said titanium film;
forming an inter-layer film on said titanium nitride film;
forming a photo resist having a predetermined pattern on said inter-layer film; and
partially exposing said titanium nitride film by partially etching said inter-layer film to form a via hole;
wherein said partially exposing said titanium nitride film includes conducting a first nitrogen plasma process after said partially etching said inter-layer firm.

* * * * *